(12) United States Patent
Chang et al.

(10) Patent No.: US 7,712,518 B2
(45) Date of Patent: May 11, 2010

(54) HEAT DISSIPATION APPARATUS

(75) Inventors: Jung-Wen Chang, Tao Yuan Shien (TW); Chun-Feng Lai, Sanchung (TW)

(73) Assignee: Quanta Computer Inc., Tao Yuan Shien (TW)

( * ) Notice: Subject to any disclaimer, the term of this patent is extended or adjusted under 35 U.S.C. 154(b) by 704 days.

(21) Appl. No.: 11/439,220

(22) Filed: May 24, 2006

(65) Prior Publication Data

US 2007/0187068 A1 Aug. 16, 2007

(30) Foreign Application Priority Data

Feb. 13, 2006 (TW) .............................. 95202468 U

(51) Int. Cl.
*F28F 7/00* (2006.01)
(52) U.S. Cl. ..................................... 165/80.2; 165/185

(58) Field of Classification Search ................. 165/80.2, 165/80.3, 80.4, 80.5, 185
See application file for complete search history.

(56) References Cited

U.S. PATENT DOCUMENTS 4,537,246 A * 8/1985 Lloyd ......................... 165/80.2
7,283,364 B2 * 10/2007 Refai-Ahmed et al. ...... 165/185

* cited by examiner

*Primary Examiner*—Ljiljana (Lil) V Ciric
(74) *Attorney, Agent, or Firm*—Rabin & Berdo, PC

(57) ABSTRACT

A heat dissipation apparatus used in a computer comprises a heat sink and a star-shaped spring with multiple directional arms, wherein each directional arm extends in a corresponding direction, and the tangent direction of the corresponding contact boundary formed by securing the direction arm to the heat sink is perpendicular to the corresponding direction. The force imposed from the spring on the heat sink is uniform as a result of the perpendicular mechanism.

6 Claims, 4 Drawing Sheets

HEAT DISSIPATION APPARATUS

RELATED APPLICATIONS

The present application is based on, and claims priority from, Taiwan Application Serial Number 95202468, filed Feb. 13, 2006, the disclosure of which is hereby incorporated by reference herein in its entirety.

BACKGROUND

1. Field of Invention

The present invention relates to a heat dissipation apparatus. More particularly, the present invention relates to a heat dissipation capable of averaging the imposed force on the heat sink.

2. Description of Related Art

To meet the demands of modern life, and progress in technology, electronic devices are increasingly able to provide more functions and services. For example, portable notebooks are a popular and successful product and not only because of the reasons stated above, but also because they are light and small in size.

Most notebooks have a heat dissipation apparatus to lower the high temperatures generated by working electronic elements. If the temperatures are not lowered adequately, once the temperature is higher than the critical temperature, the electronic components would get damaged.

A heat dissipation apparatus usually comprises of a heat sink and a spring. Heat dissipation efficiency (heat conduction) depends on the compactness of the contact area between the heat sink and the electronic component. If the compactness of the contact area between the heat sink and the electronic component is high (it is good for heat conduction), the heat dissipation efficiency is high; and if the compactness of the contact area between the heat sink and the electronic component is low, the heat dissipation efficiency is low.

Heat sinks usually have deformed shapes instead of rectangular shapes in order to meet the space limitations and element placement in an electronic device such as a notebook. The ability of a spring to apply a uniform force to a heat sink with a deformed shape is lower than the ability of the spring to apply a uniform force to a heat sink with a regular shape. Therefore, if a spring is used to apply a force to a heat sink with a deformed shape, the compactness of the contact plane between the heat sink and the electronic component is low and is therefore not effective for lowering the temperature (the higher the compactness the better heat efficiency).

FIG. 1 shows a schematic diagram for one kind of conventional heat dissipation apparatus 100. The heat dissipation apparatus 100 used to expel hot air generated by an electronic component (not shown) includes a heat sink 21 and a spring 10. The spring 10 that is used to secure the heat sink 21 to an electronic component (not shown) usually has an angular shape. The angular shaped spring 10 secures the heat sink 21 to the electronic component (not shown) and prevents the heat sink 21 from breaking away from the electronic component (not shown) and effectively prevents a reduction in the heat dissipation efficiency of the heat sink 21.

SUMMARY

It is therefore an aspect of the present invention to provide a heat dissipation apparatus to enhance the heat dissipation efficiency.

The heat dissipation apparatus comprises a heat sink and an angular shaped spring with multiple directional arms, wherein each of the directional arms extends in a corresponding direction to secure the heat sink, and the tangent directions of the contact boundary between the heat sink and the multi directional arms on the spring are perpendicular to the directions of the arm extensions. If the above tangents are indeed perpendicular to the direction of the spring arms, the force imposed from the spring on the heat sink would be uniform throughout the heat sink and the compactness of the contact area between the heat sink and the electronic component would be higher and the heat dissipation efficiency would increase hence lowering the risk of a system crash or damage due to overheating.

BRIEF DESCRIPTION OF THE DRAWINGS

These and other features, aspects and advantages of the present invention will become better understood with regard to the following description, appended claims and accompanying drawings where:

DESCRIPTION OF THE PREFERRED EMBODIMENTS

Figure 1:
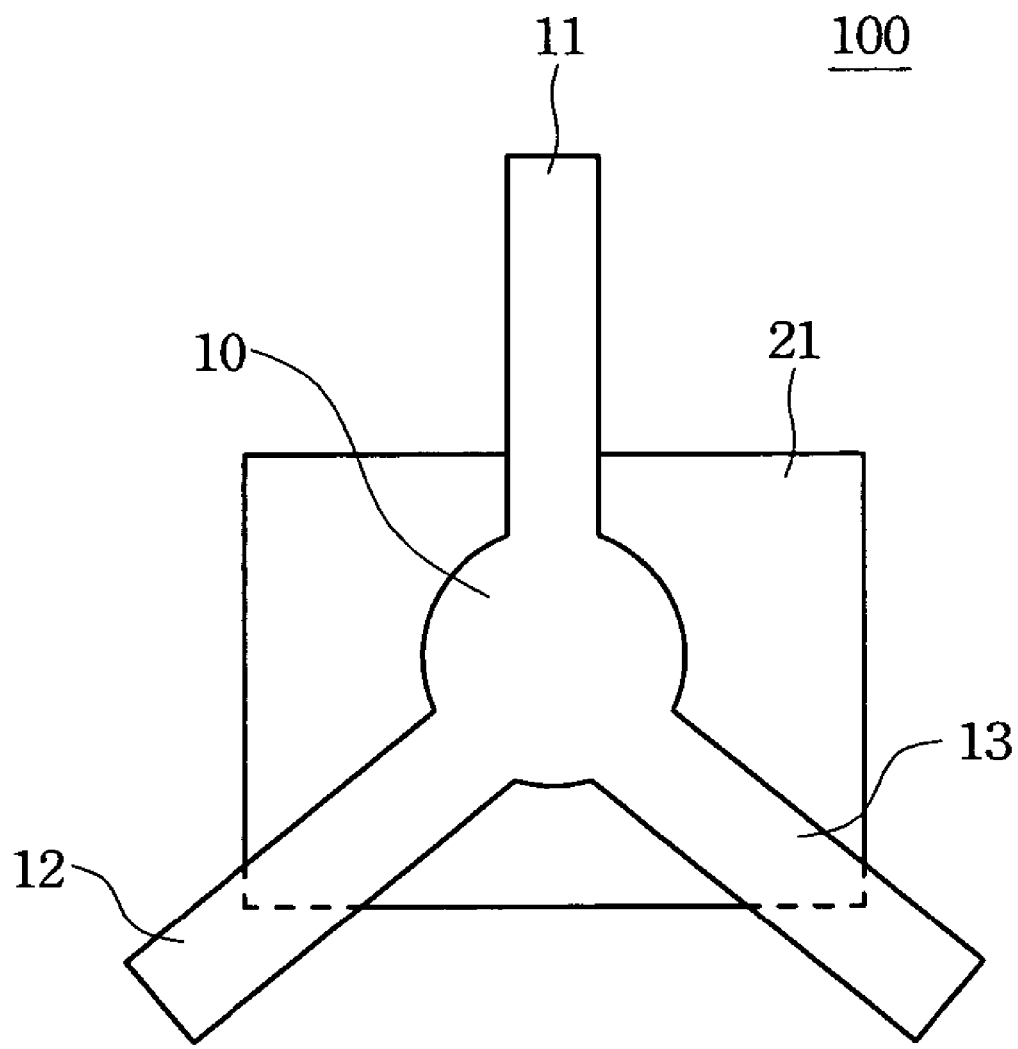
FIG. 1 is a schematic diagram of a conventional heat dissipation apparatus.
Figure 2:
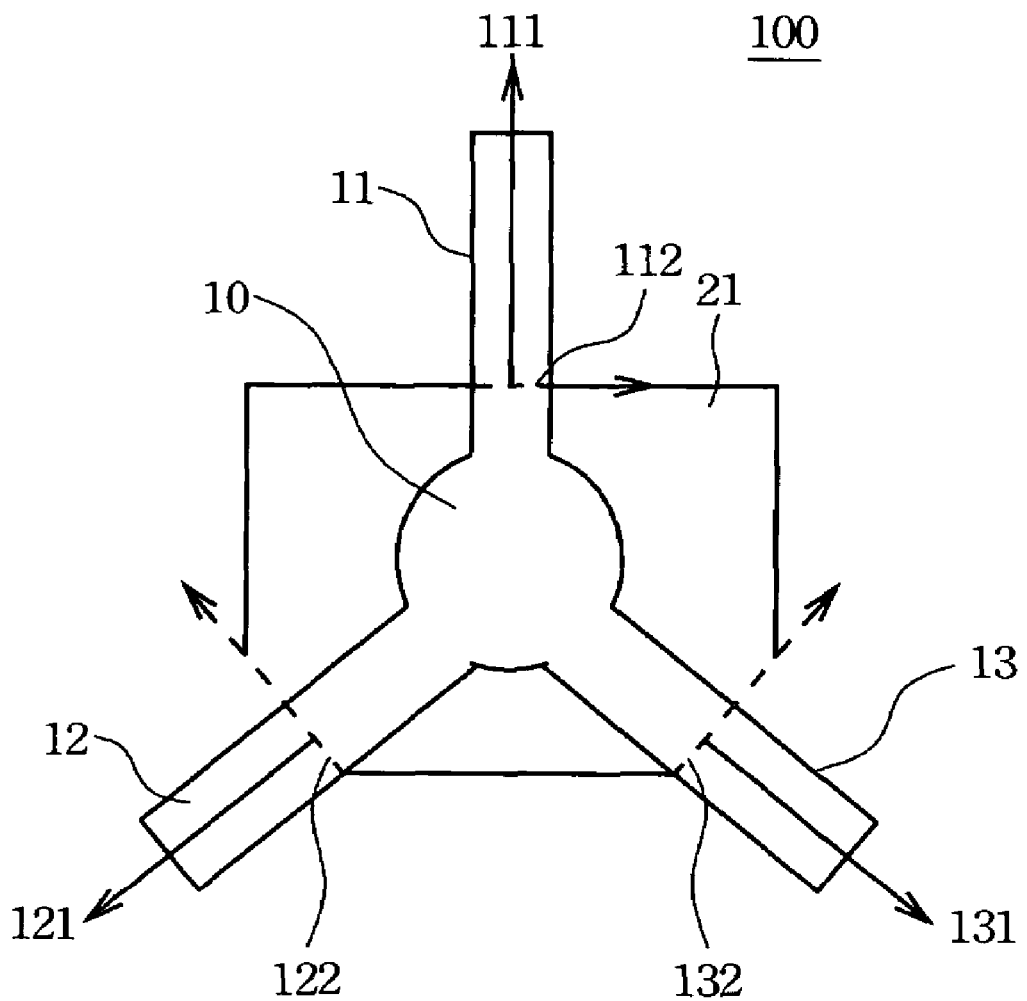
FIG. 2 is a schematic diagram of a heat dissipation apparatus in accordance with a preferred embodiment of the present invention.

FIG. 2 is a schematic diagram of a heat dissipation apparatus in accordance with a preferred embodiment of the present invention. In FIG. 2, star-shaped spring 10 has three directional arms 11, 12 and 13 that respectively extend in three corresponding directions 111, 121 and 131 and are directly secured on the heat sink 21 to form three pieces of contact boundaries. Tangent directions 122 and 132 of the contact boundary between the heat sink 21 and the directional arms 12 and 13 of the star-shaped spring 10 are perpendicular to the corresponding directions 121 and 131, respectively. In the embodiment, the tangent direction 112 is originally perpendicular to the corresponding direction 111. The difference between FIG. 1 and FIG. 2 is that all the tangent directions 112, 122 and 132 in FIG. 2 are perpendicular to the corresponding directions 111, 121 and 131 respectively, whereas apart from the tangent direction for directional arm 11, the remaining tangent directions in FIG. 1 are not perpendicular to the directional arms 12 and 13. The advantage is that, with the perpendicular mechanism (FIG. 2), the ability of the star-shaped spring 10 to exert a uniform force on the heat sink is higher than if the tangents to the directional arms are not perpendicular (FIG. 1).

Figure 3:
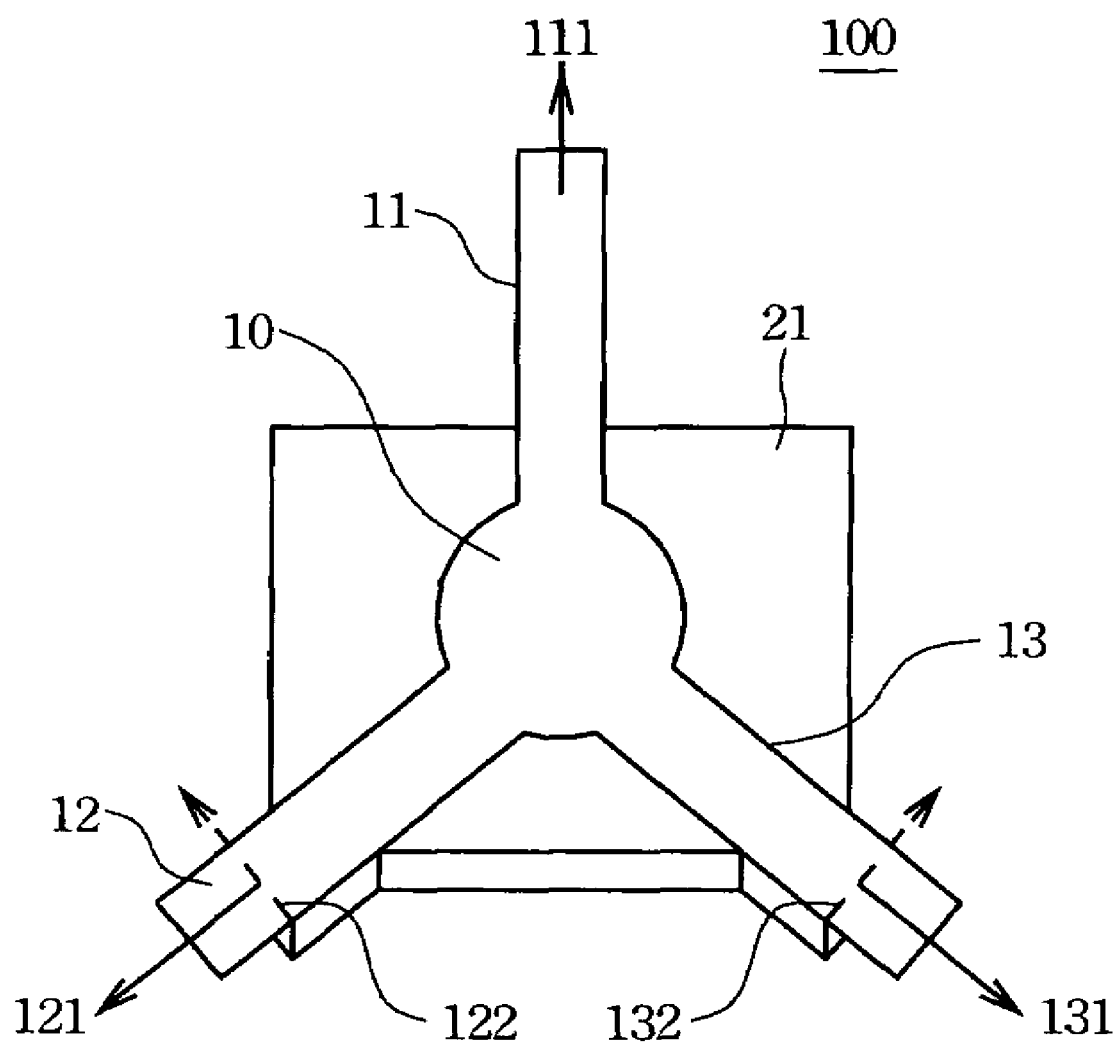
FIG. 3 is a schematic diagram of a heat dissipation apparatus in accordance with another preferred embodiment of the present invention.

FIG. 3 is a schematic diagram of a heat dissipation apparatus in accordance with another preferred embodiment of the present invention. The distinction between the two embodiments (FIG. 2 and FIG. 3) is the perpendicular mechanism between the tangent directions 112, 122 and 132 and the corresponding directions 111, 121 and 131. In FIG. 2, the corners on the lower right and lower left sides of the heat sink are "cut" to form the tangent directions 122 and 132 which are perpendicular to the corresponding directions 121 and 131 respectively. In FIG. 3 the corners on the lower right and lower left side of the heat sink are "extended" to form the tangent directions 122 and 132 which are also perpendicular to corresponding directions 121 and 131 respectively.

Another advantage in this embodiment (FIG. 3) is that extending the corners of the heat sink 21 is equivalent to shortening the directional arms 12 and 13, in other words this could increase the magnitude of force imposed by star-shaped spring 10 on the heat sink 21 without any additional placement space. Thus the contact area would be more compact and better heat dissipation efficiency could be achieved.

The spirit of the invention is that the corresponding directions of the multi directional arms have to be perpendicular to the tangent directions of the contact boundary between the heat sink and the multi directional arms on the spring. Therefore, the shape of the star-shaped spring 10 does not matter (and is not limited to a tri-star spring with three directional arms 11, 12 and 13) as long as the heat sink 21 could be fixed firmly.

Figure 4:
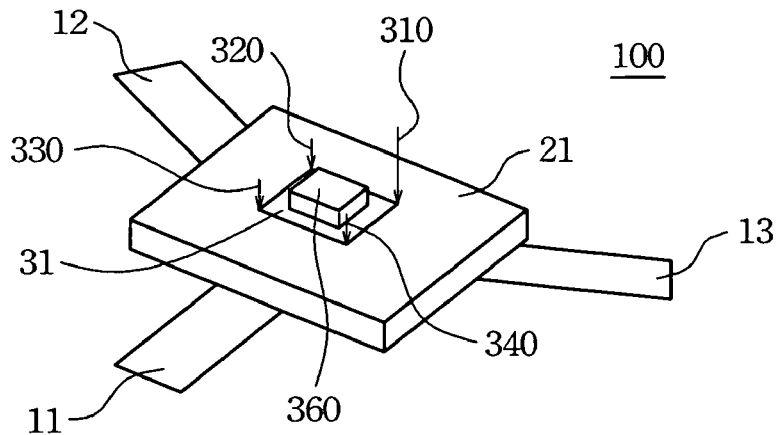
FIG. 4 is a force simulation diagram of a conventional heat dissipation apparatus.

FIG. 4 is a force simulation diagram of a conventional heat dissipation apparatus (FIG. 1). The central area 31 represents the zone of an electronic component 360 (a central processing unit (CPU), a chipset or a graphic processing unit (GPU) for example) on which the force from a heat sink 21 is imposed. The arrow symbols 310, 320, 330 and 340 represent the magnitude of the imposed force: the longer the arrow the larger the magnitude. From FIG. 4, it could be understood that due to space limitations and element placement, the contact boundary between the heat sink 21 and the multi directional arms 11, 12 and 13 on the spring could not be designed so the previously mentioned perpendicular mechanism mentioned above and the force imposed would not be uniform on the heat sink 21, in other words the length of those arrow symbols 310, 320 330 and 340 at the four corners of the central area 31 are not the same.

Figure 5:
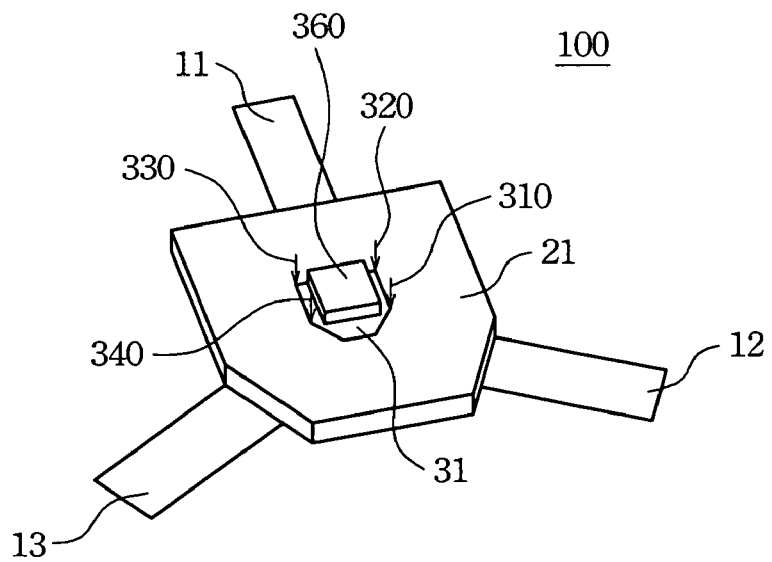
FIG. 5 is a force simulation diagram of a heat dissipation apparatus in accordance with a preferred embodiment of the present invention.

FIG. 5 is a force simulation diagram of a heat dissipation apparatus in accordance with a preferred embodiment of the present invention (FIG. 2). The central area 31 represents the zone of an electronic component 360 (a CPU, chipset or GPU for example) on which the force from a heat sink 21 is imposed. The arrow symbols 310, 320, 330 and 340 represent the magnitude of the imposed force: the longer the length of the arrow the larger of the magnitude. From FIG. 5, the lengths of each arrow symbol 310, 320, 330 and 340 are almost the same because the corresponding directions (refer to FIG. 3) of the directional arms 11, 12 and 13 are perpendicular to the tangent direction (refer to FIG. 3) of the contact boundary between the heat sink 21 and the directional arms 11, 12 and 13 on the spring.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A heat dissipation apparatus applicable to an electronic component, comprising:
   a heat sink placed on the electronic component; and
   a star-shaped spring secured on the heat sink and having at least three directional arms, wherein each directional arm extends along a corresponding direction, and a tangent directions of a corresponding contact boundary formed by securing the directional arm to the heat sink is perpendicular to the corresponding direction.

2. The heat dissipation apparatus as claimed in claim 1, wherein the corresponding contact boundary of the heat sink is extended to be perpendicular to the corresponding direction.

3. The heat dissipation apparatus as claimed in claim 1, wherein the spring is a tri-star spring.

4. The heat dissipation apparatus as claimed in claim 1, wherein the electronic component is a central processing unit.

5. The heat dissipation apparatus as claimed in claim 1, wherein the electronic component is a chipset.

6. The heat dissipation apparatus as claimed in claim 1, wherein the electronic component is a graphic processing unit.

* * * * *